(12) United States Patent
Kato et al.

(10) Patent No.: US 9,125,256 B2
(45) Date of Patent: Sep. 1, 2015

(54) ILLUMINATION DEVICE

(71) Applicant: KABUSHIKI KAISHA TOSHIBA, Minato-ku (JP)

(72) Inventors: Daimotsu Kato, Tokyo (JP); Hayato Kakizoe, Kanagawa-ken (JP); Tomoko Sugizaki, Kanagawa-ken (JP); Tomoaki Sawabe, Tokyo (JP); Keiji Sugi, Kanagawa-ken (JP); Akio Amano, Tokyo (JP); Yasushi Shinjo, Kanagawa-ken (JP); Tomio Ono, Kanagawa-ken (JP); Shintaro Enomoto, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 39 days.

(21) Appl. No.: 14/047,174

(22) Filed: Oct. 7, 2013

(65) Prior Publication Data
US 2014/0139104 A1  May 22, 2014

(30) Foreign Application Priority Data
Nov. 20, 2012  (JP) .................................. 2012-254573

(51) Int. Cl.
*H05B 33/04* (2006.01)
*H01L 51/52* (2006.01)
*F21K 99/00* (2010.01)
*F21V 31/00* (2006.01)
*F21V 3/02* (2006.01)
*F21Y 101/02* (2006.01)
*F21Y 105/00* (2006.01)

(52) U.S. Cl.
CPC .............. *H05B 33/04* (2013.01); *F21K 9/135* (2013.01); *F21K 9/17* (2013.01); *H01L 51/5237* (2013.01); *F21V 3/02* (2013.01); *F21V 31/00* (2013.01); *F21Y 2101/02* (2013.01); *F21Y 2105/008* (2013.01)

(58) Field of Classification Search
None
See application file for complete search history.

(56) References Cited

U.S. PATENT DOCUMENTS 6,641,933 B1 *  11/2003  Yamazaki et al. ............ 428/690
2003/0057422 A1 *  3/2003  Yamazaki et al. ............ 257/79

FOREIGN PATENT DOCUMENTS

JP    2003-86361    3/2003

* cited by examiner

*Primary Examiner* — Ashok Patel
(74) *Attorney, Agent, or Firm* — Oblon, McClelland, Maier & Neustadt, L.L.P.

(57) ABSTRACT

In general, according to one embodiment, an illumination device includes a light emitting unit, a connection unit, a containing unit, and a second sealing unit. The light emitting unit includes a first substrate, a second substrate, an organic electroluminescent element, and a first sealing unit. The organic electroluminescent element is provided between the first substrate and the second substrate. The first sealing unit seals circumferential edge portions between the first substrate and the second substrate. The connection unit supplies power to the organic electroluminescent element. The containing unit has a space being airtight in an interior of the containing unit. The containing unit contains the light emitting unit inside the space. The second sealing unit is provided in the containing unit. The second sealing unit seals between a portion of the unit extending outside the containing unit and the containing unit.

19 Claims, 8 Drawing Sheets

ILLUMINATION DEVICE

CROSS-REFERENCE TO RELATED APPLICATIONS

This application is based upon and claims the benefit of priority from the prior Japanese Patent Application No. 2012-254573, filed on Nov. 20, 2012; the entire contents of which are incorporated herein by reference.

FIELD

Embodiments described herein relate generally to an illumination device.

BACKGROUND

There is an illumination device in which an organic electroluminescent element that includes an organic light emitting layer is provided between a pair of glass substrates. In such an illumination device, circumferential edge portions of the pair of glass substrates are sealed with a sealing unit made of a resin.

However, the sealing unit made of the resin cannot prevent moisture, oxygen, etc., from passing through; and there is a risk that the product life of the illumination device may shorten.

Therefore, an illumination device in which a desiccant is provided to remove the moisture that passes through the sealing unit has been proposed.

However, it is difficult to completely remove the moisture, oxygen, etc., that pass through the sealing unit; and it is desirable to develop an illumination device that can further lengthen the product life.

DETAILED DESCRIPTION

Figure 1A:
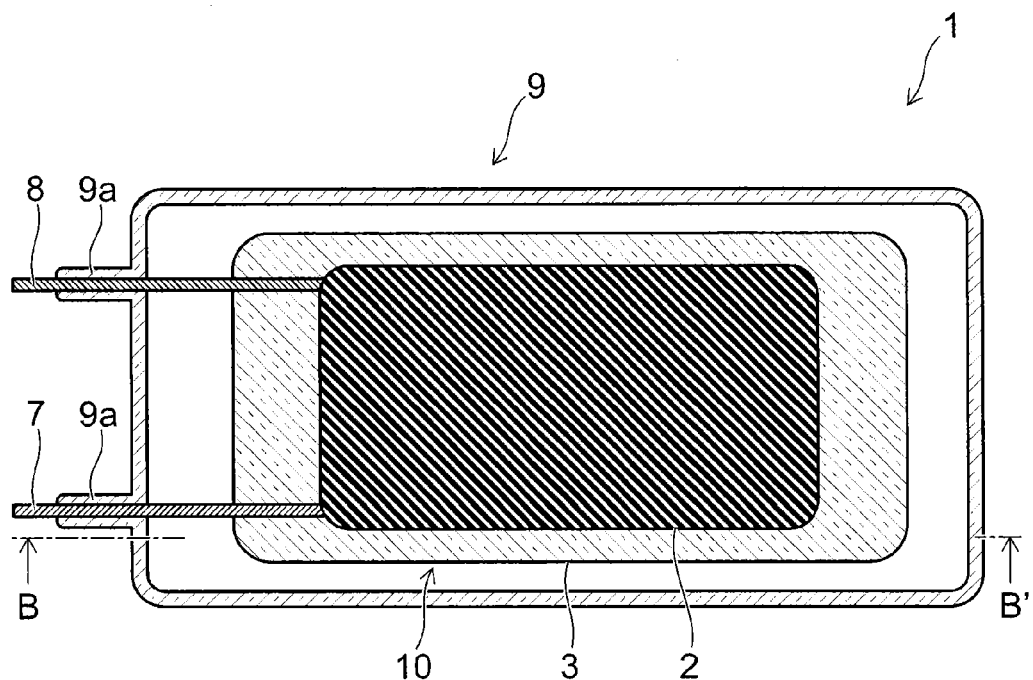
FIGS. 1A and 1B are schematic cross-sectional views showing an illumination device according to a first embodiment.

In general, according to one embodiment, an illumination device includes a light emitting unit, a connection unit, a containing unit, and a second sealing unit. The light emitting unit includes a first substrate, a second substrate, an organic electroluminescent element, and a first sealing unit. The organic electroluminescent element is provided between the first substrate and the second substrate. The first sealing unit seals circumferential edge portions between the first substrate and the second substrate. The connection unit supplies power to the organic electroluminescent element. The containing unit has a space being airtight in an interior of the containing unit. The containing unit contains the light emitting unit inside the space. The second sealing unit is provided in the containing unit. The second sealing unit seals between a portion of the connection unit extending outside the containing unit and the containing unit.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
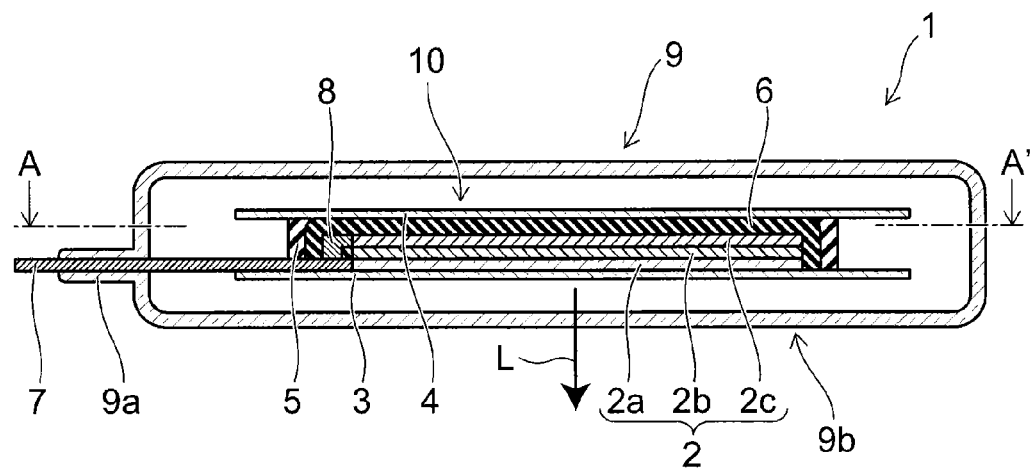

FIGS. 1A and 1B are schematic cross-sectional views showing an illumination device 1 according to a first embodiment.

FIG. 1A is a cross-sectional view along line A-A' of FIG. 1B. FIG. 1B is a cross-sectional view along line B-B' of FIG. 1A.

As shown in FIGS. 1A and 1B, a light emitting unit 10, a connection unit 7, a connection unit 8, and a containing unit 9 are provided in the illumination device 1.

An organic electroluminescent element 2, a substrate 3 (corresponding to an example of a first substrate), a substrate 4 (corresponding to an example of a second substrate), a sealing unit 5 (corresponding to an example of a first sealing unit), and a sealing unit 6 are provided in the light emitting unit 10.

The organic electroluminescent element 2 includes an electrode 2$a$ (corresponding to an example of a first electrode), an organic light emitting layer 2$b$, and an electrode 2$c$ (corresponding to an example of a second electrode).

The organic electroluminescent element 2 is provided on the substrate 3.

The electrode 2$a$ is provided on the surface of the substrate 3 on the side facing the substrate 4. The planar configuration of the electrode 2$a$ is a rectangular configuration. However, the configuration of the electrode 2$a$ is not limited to those illustrated and may be modified appropriately according to the size, application, etc., of the illumination device 1. The electrode 2$a$ functions as, for example, an anode.

The electrode 2$a$ is transmissive to light radiated from the organic light emitting layer 2$b$. The material of the electrode 2$a$ may include, for example, an oxide including an element of at least one species selected from the group consisting of In, Sn, Zn, and Ti. The material of the electrode 2$a$ may include, for example, indium oxide, zinc oxide, tin oxide, indium tin oxide (ITO), fluorine doped tin oxide (FTO), an electrically conductive glass including indium zinc oxide (e.g., NESA or the like), an electrically conductive organic film (Pedot or the like), Ag nanowires, a transparent electrically conductive film using graphene, etc.

The organic light emitting layer 2$b$ is provided between the electrode 2$a$ and the electrode 2$c$.

The thickness dimension of the organic light emitting layer 2b may be, for example, not less than 5 nanometers (nm).

The organic light emitting layer 2b radiates, for example, light having a component of a wavelength of visible light. The organic light emitting layer 2b may radiate, for example, white light. "White light" may be substantially white light or may be white light that is, for example, reddish, yellowish, greenish, bluish, violet-tinted, etc.

The organic light emitting layer 2b may include a mixed material of a host material and a dopant (a light emitting dopant) that emits light of a prescribed color.

In the case where the organic light emitting layer 2b radiates white light, the organic light emitting layer 2b may include dopants (a green light emitting dopant, a blue light emitting dopant, and a red light emitting dopant) that emit green, blue, and red light, respectively. If green, blue, and red light can be radiated, white light can be synthesized from the green, blue, and red light.

The organic light emitting layer 2b may be made of a single layer or may be made of multiple layers.

For example, the organic light emitting layer 2b may be a layer including a green light emitting dopant, a blue light emitting dopant, and a red light emitting dopant. For example, the organic light emitting layer 2b may include a layer including a green light emitting dopant, a layer including a blue light emitting dopant, and a layer including a red light emitting dopant that are stacked.

For example, CBP (4,4'-N,N'-bis dicarbazole biphenyl), BCP (2,9-dimethyl-4,7-diphenyl-1,10-phenanthroline), TPD (tetraphenyl diaminobiphenyl), PVK (polyvinyl carbazole), PPT (poly(3-phenylthiophene)), and the like are examples of the host material of the organic light emitting layer 2b. For example, Ir(ppy)$_3$ (tris(2-phenylpyridine)iridium) and the like are examples of the green light emitting dopant of the organic light emitting layer 2b.

For example, Flrpic (iridium (III) bis(4,6-di-fluorophenyl)-pyridinato-N,C2'-picolinate) and the like are examples of the blue light emitting dopant of the organic light emitting layer 2b.

For example, Flr6 (bis(2,4-difluorophenylpyridinato)-tetrakis(1-pyrazolyl)borate-iridium (III)) and the like are examples of the red light emitting dopant of the organic light emitting layer 2b.

The synthesis of white light is not limited to the combination of green, blue, and red light. For example, a combination of green light and red light may be used. In such a case, the green light may be light of a mixed color of green light and blue light according to the chromaticities of the green light and the white light that are necessary.

The color of the light radiated from the organic light emitting layer 2b is not limited to white and may be modified appropriately according to the application of the illumination device 1, etc. The color of the light radiated from the organic light emitting layer 2b may be changed by the type of the light emitting dopants, the combination of multiple types of light emitting dopants, the addition ratio of the multiple types of light emitting dopants, etc.

The electrode 2c is provided to face the electrode 2a. The electrode 2c is provided to cover the organic light emitting layer 2b.

The electrode 2c is reflective to the light radiated from the organic light emitting layer 2b. The optical reflectance of the electrode 2c is higher than the optical reflectance of the electrode 2a. In the specification of the application, the state of having an optical reflectance that is higher than the optical reflectance of the electrode 2a is referred to as being reflective.

The electrode 2c functions as, for example, a cathode. The thickness dimension of the electrode 2c may be, for example, not less than 5 nanometers (nm). If the thickness dimension of the electrode 2c is 5 nanometers (nm) or more, a portion of the light radiated from the organic light emitting layer 2b is reflected; and the current can be supplied effectively to the organic light emitting layer 2b.

The electrode 2c includes, for example, at least one selected from aluminum and silver. For example, the electrode 2c includes aluminum.

If necessary, the organic electroluminescent element 2 may further include a not-shown first functional layer and a not-shown second functional layer.

The not-shown first functional layer is provided between the organic light emitting layer 2b and the electrode 2a.

The thickness dimension of the first functional layer may be, for example, not less than 1 nanometer (nm) and not more than 500 nanometers (nm).

The first functional layer may function as, for example, a hole injection layer. In the case where the first functional layer functions as the hole injection layer, the first functional layer includes, for example, Pedot: PPS poly(3,4-ethylenedioxythiophene)-poly(styrenesulfonic acid), CuPc (copper phthalocyanine), $MoO_3$ (molybdenum trioxide), etc.

The first functional layer may function as, for example, a hole transport layer. In the case where the first functional layer functions as the hole transport layer, the first functional layer includes, for example, α-NPD (4,4'-bis[N-(1-naphthyl)-N-phenylamino]biphenyl), TAPC (1,1-bis[4-N,N-di(p-tolyl)amino]phenyl]cyclohexane), m-MTDATA (4,4',4"-tris[phenyl(m-tolyl)amino]triphenylamine), TPD (bis(3-methyl phenyl)-N,N'-diphenylbenzidine), TCTA (4,4',4"-tri(N-carbazolyl)triphenylamine), etc.

The first functional layer may include a layer that functions as a hole injection layer stacked with a layer that functions as a hole transport layer. In such a case, the layer that functions as the hole injection layer improves the injection characteristics of the holes. The layer that functions as the hole injection layer is provided between the electrode 2a and the layer that functions as the hole transport layer.

The not-shown second functional layer is provided between the organic light emitting layer 2b and the electrode 2c. The thickness dimension of the second functional layer may be, for example, not less than 1 nanometer (nm) and not more than 500 nanometers (nm).

The second functional layer may function as, for example, an electron transport layer. In the case where the second functional layer functions as the electron transport layer, the second functional layer includes, for example, Alq3 (tris(8-quinolinolato)aluminum (III), BAlq (bis(2-methyl-8-quinolinolato-N1,O8)-(1,1'-biphenyl-4-olato)aluminum), Bphen (bathophenanthroline), 3TPYMB (tris[3-(3-pyridyl)-mesityl]borane), etc.

The second functional layer may function as, for example, an electron injection layer. In the case where the second functional layer functions as the electron injection layer, the second functional layer includes, for example, lithium fluoride, cesium fluoride, lithium quinoline complex, etc.

The second functional layer may include a layer that functions as an electron transport layer stacked with a layer that functions as an electron injection layer. In such a case, the layer that functions as the electron injection layer improves the injection characteristics of the electrons. The layer that functions as the electron injection layer is provided between the electrode 2c and the layer that functions as the electron transport layer.

The substrate 3 and the substrate 4 have plate configurations and are provided as a pair. The substrate 4 is provided on the side of the substrate 3 where the organic electroluminescent element 2 is provided. The substrate 4 is provided to face the substrate 3. The surface of the substrate 3 on the side opposite to the side on which the organic electroluminescent element 2 is provided is the surface on the side where light L is radiated.

The substrate 3 is transmissive to the light L radiated from the organic light emitting layer 2b.

The material of the substrate 3 may include, for example, glass such as quartz glass, alkali glass, alkali-free glass, etc. The material of the substrate 3 may include, for example, a transparent resin such as polyethylene terephthalate, polycarbonate, polymethyl methacrylate, polypropylene, polyethylene, amorphous polyolefin, a fluoric resin, etc.

Although the material of the substrate 4 is not particularly limited, the material of the substrate 4 may be similar to, for example, the material of the substrate 3.

The sealing unit 5 is provided at the circumferential edge portions of the substrate 3 and the substrate 4 to seal the circumferential edge portions of the substrate 3 and the substrate 4.

The material of the sealing unit 5 may be, for example, a resin, glass frit, etc.

For example, an ultraviolet-curing resin, a thermosetting resin, and the like are examples of the resin of the sealing unit 5. For example, magnesium oxide (MgO), calcium oxide (CaO), and the like are examples of glass frit of the sealing unit 5.

The sealing unit 6 is provided in a region defined by the substrate 3, the substrate 4, and the sealing unit 5. The sealing unit 6 is provided to cover the organic electroluminescent element 2.

Although the material of the sealing unit 6 is not particularly limited as long as the material of the sealing unit 6 is an insulating material, the material of the sealing unit 6 may include, for example, a resin such as an ultraviolet-curing resin or a thermosetting resin, an inorganic material such as silicon oxide, etc.

In such a case, the sealing unit 5 and the sealing unit 6 can be formed integrally if the material of the sealing unit 5 and the material of the sealing unit 6 are the same.

One end portion of the connection unit 7 is electrically connected to the electrode 2a. One other end portion of the connection unit 7 is provided outside the containing unit 9.

One end portion of the connection unit 8 is electrically connected to the electrode 2c. One other end portion of the connection unit 8 is provided outside the containing unit 9.

Therefore, a power supply, etc., provided outside the illumination device 1 can be electrically connected to the electrode 2a and the electrode 2c via the connection unit 7 and the connection unit 8, respectively.

The portions of the connection unit 7 and the connection unit 8 that extend outside the containing unit 9 are sealed respectively by sealing units 9a (corresponding to examples of second sealing units) of the containing unit 9.

The light emitting unit 10 is held in the space of the interior of the containing unit 9 by the connection unit 7 and the connection unit 8.

Although the materials of the connection unit 7 and the connection unit 8 are not particularly limited as long as the materials of the connection unit 7 and the connection unit 8 are electrically conductive materials, it is favorable for these materials to have coefficients of thermal expansion near the coefficients of thermal expansion of the sealing units 9a.

For example, as described below, in the case where the materials of the sealing units 9a are glass, the materials of the connection unit 7 and the connection unit 8 may be molybdenum, etc.

The containing unit 9 has a tubular configuration having two closed ends in the longitudinal direction.

The containing unit 9 has a space in the interior of the containing unit 9 that is airtight; and the containing unit 9 contains the light emitting unit 10 inside the space. Although the cross-sectional outline of the containing unit 9 shown in FIGS. 1A and 1B is a rectangle, this is not limited thereto. For example, the cross-sectional outline may have a flattened configuration.

The two sealing units 9a that seal the portions of the connection unit 7 and the connection unit 8 that extend outside the containing unit 9 are provided at the longitudinal-direction end portion of the containing unit 9. In such a case, the two sealing units 9a may be formed integrally with the longitudinal-direction end portion of the containing unit 9.

At least a surface 9b of the containing unit 9 on the side where the light L is radiated is transmissive to the light L.

Although the material of the containing unit 9 is not particularly limited, it is favorable for the material of the containing unit 9 to be glass, etc., when considering being transmissive to the light L, being able to suppress the transmission of moisture, oxygen, or the like, etc. In such a case, for example, quartz glass, alkali glass, alkali-free glass, and the like are examples of the glass.

In the case where the material of the containing unit 9 is glass, for example, the connection unit 7 and the connection unit 8 can be sealed by the two sealing units 9a when forming the two sealing units 9a by pinch sealing. For example, the two sealing units 9a in which the connection unit 7 and the connection unit 8 are respectively buried can be formed by using pinchers to squeeze the portions used to form the sealing units 9a that are heated.

The connection unit 7 and the connection unit 8 can be sealed by the two sealing units 9a while forming the two sealing units 9a by shrink sealing (reduced-pressure sealing). For example, the two sealing units 9a in which the connection unit 7 and the connection unit 8 are respectively buried can be formed by depressurizing the interiors of the portions used to form the sealing units 9a that are heated and by the portions used to form the sealing units 9a being squeezed by the negative pressure.

When sealing with the sealing units 9a, the space of the interior of the containing unit 9 may be in a state of being depressurized below atmospheric pressure by evacuating the space in the interior of the containing unit 9 in which the light emitting unit 10 is held. It is also possible to seal an inert gas such as argon gas, nitrogen gas, etc., in the space in the interior of the containing unit 9 in which the light emitting unit 10 is held.

Here, the organic electroluminescent element 2 is used in various illumination devices due to the advantages of excellent visibility, excellent shock resistance, and diverse light emission colors.

However, the organic electroluminescent element 2 has the disadvantage that, when the organic electroluminescent element 2 is driven for a constant period of time, the light emission characteristics such as the light emission luminance, the uniformity of the light emission, etc., are markedly degraded compared to those in the initial state. Causes of such degradation of the light emission characteristics include the moisture and/or oxygen adsorbed to the surfaces of the components of the organic electroluminescent element 2 and the moisture and/or oxygen that penetrate the organic electroluminescent element 2.

Oxygen reacts with the organic light emitting layer 2b and oxidizes the organic light emitting layer 2b by penetrating the interior of the organic electroluminescent element 2 through pinholes of the electrode 2c which is the cathode, structural defects of the organic electroluminescent element 2, etc. The oxidization of the organic light emitting layer 2b leads to degradation of the material characteristics.

Moisture causes peeling between the organic light emitting layer 2b and the electrode 2c by penetrating the interior of the organic electroluminescent element 2 through defects of the electrode 2c, etc. Because conduction no longer occurs at the portions where the organic light emitting layer 2b and the electrode 2c have peeled, dark spots which are portions that do not emit light occur.

In the embodiment, the connection unit 7 and the connection unit 8 that hold the light emitting unit 10 in the space of the interior of the containing unit 9 and supply the electrical power from the outside to the light emitting unit 10 are sealed respectively by the two sealing units 9a. Therefore, the penetration of the moisture and/or oxygen into the organic electroluminescent element 2 can be suppressed over a long period of time because the light emitting unit 10 can be held inside the space in the airtight state. As a result, the occurrence of dark spots can be suppressed over a long period of time.

The penetration of the moisture and/or oxygen from the outside can be suppressed further by sealing an inert gas such as argon gas, nitrogen gas, etc., in the space of the interior of the containing unit 9.

The conduction of external heat to the organic electroluminescent element 2 can be suppressed by causing the space of the interior of the containing unit 9 to be in a state of being depressurized below atmospheric pressure.

The light emitting unit 10 is held in the space of the interior of the containing unit 9 by the connection unit 7 and the connection unit 8. In other words, the light emitting unit 10 does not contact the containing unit 9. Therefore, the external heat conducted to the organic electroluminescent element 2 can be exceedingly low. The conduction of the heat to the organic electroluminescent element 2 can be suppressed by sealing with the sealing units 9a. As a result, the degradation of the light emission characteristics of the organic electroluminescent element 2 can be suppressed.

Second Embodiment

FIG. 2A to FIG. 3C are schematic cross-sectional views showing illumination devices according to a second embodiment.

Figure 2A:
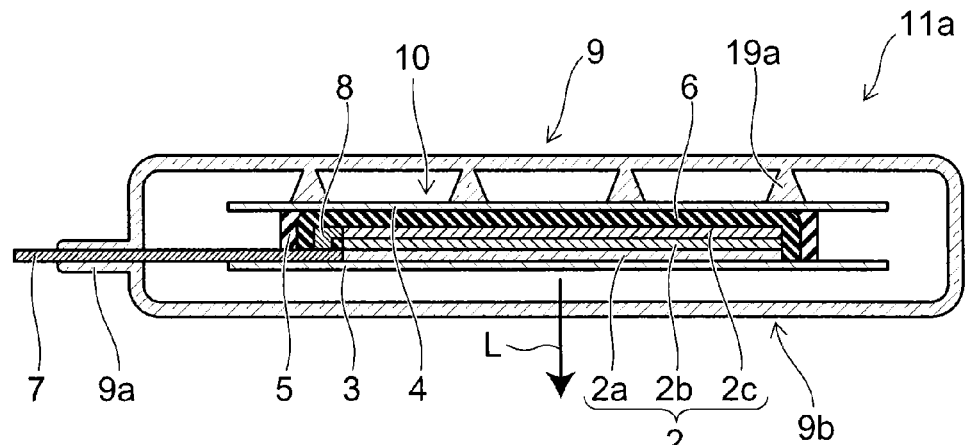
FIG. 2A to FIG. 2C are schematic cross-sectional views showing illumination devices according to a second embodiment.

As shown in FIG. 2A, the light emitting unit 10, the connection unit 7, the connection unit 8, the containing unit 9, and a support unit 19a are provided in an illumination device 11a.

In other words, the illumination device 11a is the illumination device 1 shown in FIGS. 1A and 1B in which the support unit 19a is further provided.

The support unit 19a is provided at the inner wall of the containing unit 9 on the side facing the electrode 2c. The support unit 19a supports the light emitting unit 10.

In the specification of the application, supporting includes the case of contacting the side of at least one selected from the substrate 3 and the substrate 4 and the case of being bonded to the side of at least one selected from the substrate 3 and the substrate 4.

The number, spacing, disposition, etc., of the support unit 19a are not particularly limited and may be modified appropriately by considering the size and/or configuration of the light emitting unit 10, the thermal conduction from the outside, etc.

As described above, the electrode 2c is reflective to the light radiated from the organic light emitting layer 2b. Therefore, it is unnecessary for the support unit 19a to be transmissive to the light radiated from the organic light emitting layer 2b because the light is not radiated toward the side on which the support unit 19a is provided.

The material of the support unit 19a is not particularly limited as long as the material of the support unit 19a is a material having a low thermal conductivity. In such a case, it is favorable for the thermal conductivity of the material of the support unit 19a to be not more than 1.1 times the thermal conductivity of the material of the containing unit 9. For example, the material of the support unit 19a may be the same as the material of the containing unit 9. In the case where the material of the support unit 19a is the same as the material of the containing unit 9, the support unit 19a and the containing unit 9 can be formed integrally.

The form of the support unit 19a has a columnar configuration. It is favorable for the form of the columnar configuration to suppress the conduction of the heat from the outside. For example, the cross-sectional area of the form may change from the inner wall side of the containing unit 9 toward the light emitting unit 10. In such a case, as shown in FIG. 2A, the cross-sectional area of the form may gradually increase from the inner wall side of the containing unit 9 toward the light emitting unit 10; or the cross-sectional area of the form may gradually decrease from the inner wall side of the containing unit 9 toward the light emitting unit 10.

Figure 2B:
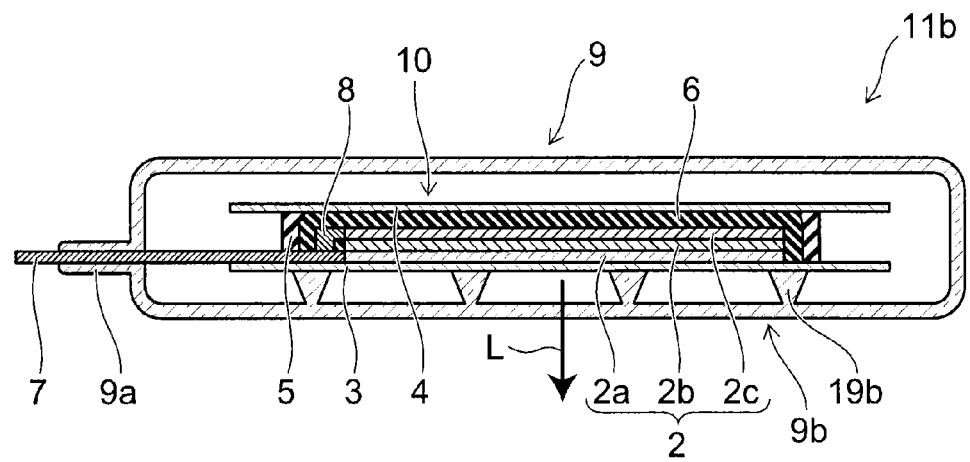

As shown in FIG. 2B, the light emitting unit 10, the connection unit 7, the connection unit 8, the containing unit 9, and a support unit 19b are provided in an illumination device 11b.

In other words, the illumination device 11b is the illumination device 1 shown in FIGS. 1A and 1B in which the support unit 19b is further provided.

The support unit 19b is provided at the inner wall of the containing unit 9 on the side facing the electrode 2a. The number, spacing, disposition, etc., of the support unit 19b are not particularly limited and may be modified appropriately by considering the size and/or configuration of the light emitting unit 10, the thermal conduction from the outside, etc.

As described above, the electrode 2a is transmissive to the light radiated from the organic light emitting layer 2b. Therefore, it is favorable for the support unit 19b to be transmissive to the light radiated from the organic light emitting layer 2b because the light is radiated toward the side on which the support unit 19b is provided.

It is favorable for the material of the support unit 19b to be a material having a low thermal conductivity. In such a case, it is favorable for the thermal conductivity of the material of the support unit 19b to be not more than 1.1 times the thermal conductivity of the material of the containing unit 9. For example, the material of the support unit 19b may be the same as the material of the containing unit 9. In the case where the material of the support unit 19b is the same as the material of the containing unit 9, the support unit 19b and the containing unit 9 can be formed integrally.

The form of the support unit 19b has a columnar configuration. It is favorable for the form of the columnar configuration to suppress the conduction of the heat from the outside and cause the light introduced to the interior of the support unit 19b to be efficiently extracted outside the illumination device 11b.

The form that suppresses the conduction of the heat from the outside is similar to the form of the support unit 19a described above.

It is favorable for the refractive index of the support unit 19b to be within a prescribed range to cause the light introduced to the interior of the support unit 19b to be efficiently extracted outside the illumination device 11b.

Details relating to the form and light extraction efficiency of the support unit 19b and the refractive index and light extraction efficiency of the support unit 19b are described below.

Figure 2C:
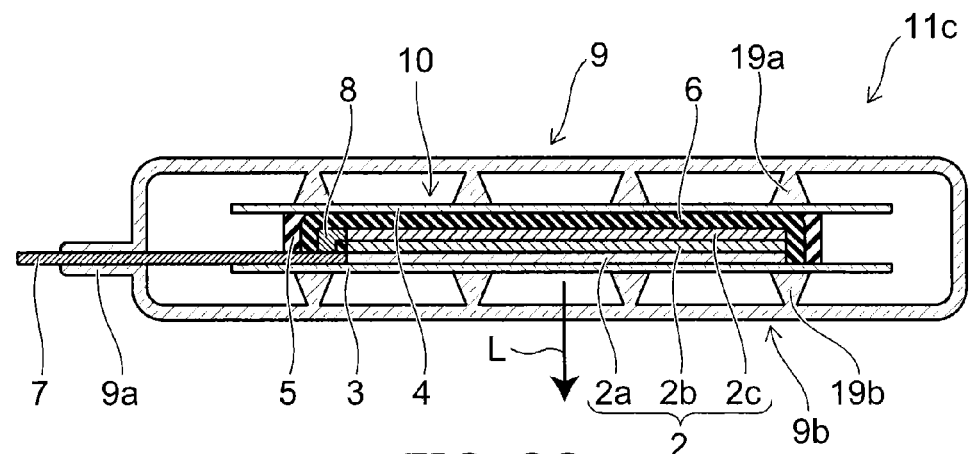

As shown in FIG. 2C, the light emitting unit 10, the connection unit 7, the connection unit 8, the containing unit 9, the support unit 19a, and the support unit 19b are provided in an illumination device 11c.

In other words, the illumination device 11c is the case where the support unit 19a and the support unit 19b that are described above are provided.

Figure 3A:
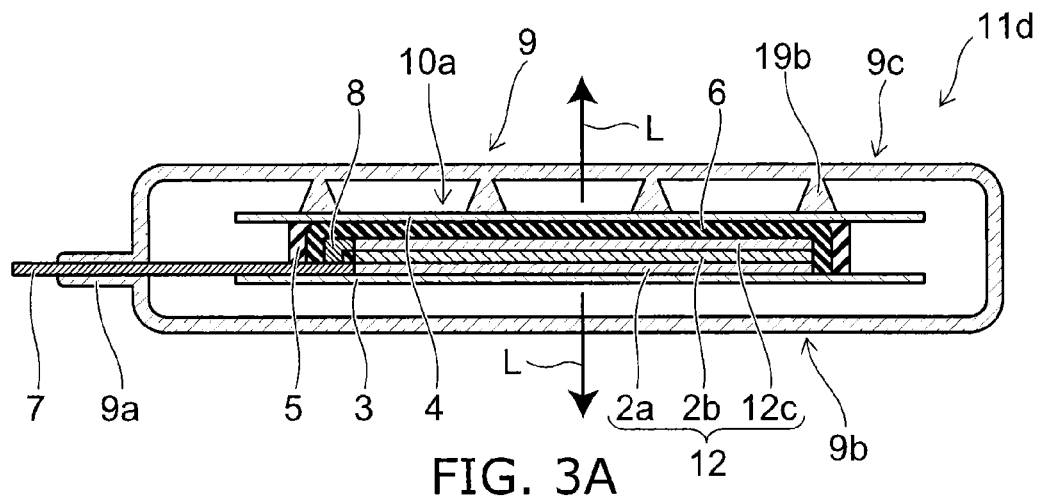
FIG. 3A to FIG. 3C are schematic cross-sectional views showing illumination devices according to a second embodiment.

As shown in FIG. 3A, a light emitting unit 10a, the connection unit 7, the connection unit 8, the containing unit 9, and the support unit 19b are provided in an illumination device 11d.

An organic electroluminescent element 12, the substrate 3, the substrate 4, the sealing unit 5, and the sealing unit 6 are provided in the light emitting unit 10a.

The organic electroluminescent element 2 includes the electrode 2a, the organic light emitting layer 2b, and an electrode 12c.

The electrode 12c is provided to cover the organic light emitting layer 2b. The electrode 12c is provided to face the electrode 2a.

The electrode 12c functions as, for example, a cathode.

The electrode 12c is transmissive to the light radiated from the organic light emitting layer 2b.

The material of the electrode 12c may be similar to, for example, the material of the electrode 2a. The material of the electrode 12c may be, for example, a magnesium-silver alloy, etc.

The light L also is radiated from a surface 9c of the containing unit 9 on the side facing the electrode 12c because the electrode 12c is transmissive to the light radiated from the organic light emitting layer 2b.

Therefore, at least the surface 9b and the surface 9c of the containing unit 9 are transmissive to the light L.

The support unit 19b that is transmissive to the light radiated from the organic light emitting layer 2b is provided at the inner wall of the containing unit 9 on the side facing the electrode 12c.

Figure 3B:
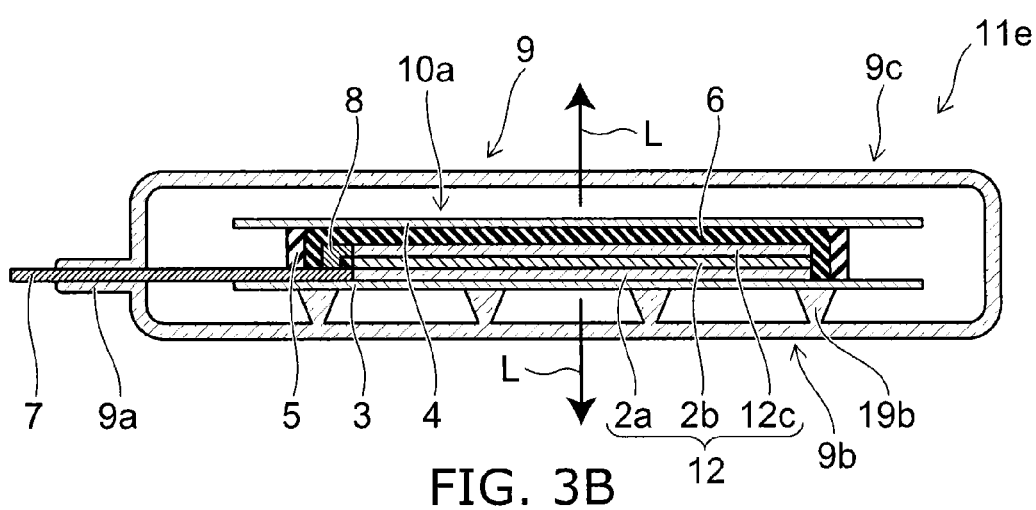

In an illumination device 11e shown in FIG. 3B, the support unit 19b is provided at the inner wall of the containing unit 9 on the side facing the electrode 2a. Although the support unit 19b is provided at the inner wall of the containing unit 9 on the side facing the electrode 2a in the illumination device 11b shown in FIG. 2B as well, the light L is radiated from the surface 9b and the surface 9c in the case of the illumination device 11e.

Figure 3C:
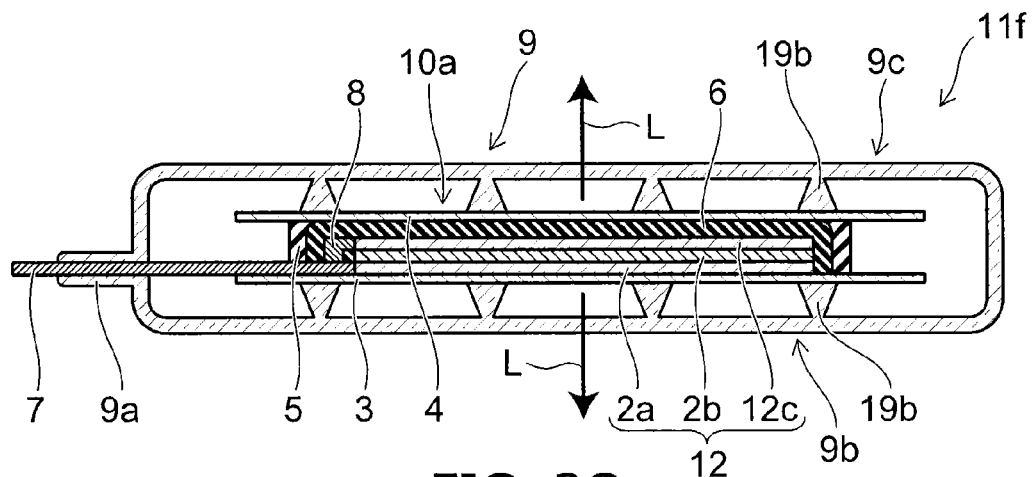

In an illumination device 11f shown in FIG. 3C, the support unit 19b is provided at the inner wall of the containing unit 9 on the side facing the electrode 12c and at the inner wall of the containing unit 9 on the side facing the electrode 2a. Although the light L is radiated from the surface 9b in the case of the illumination device 11c shown in FIG. 2C, the light L is radiated from the surface 9b and the surface 9c in the case of the illumination device 11f.

As shown in FIG. 2A to FIG. 3C, the light emitting unit 10 or the light emitting unit 10a can be held stably in the space of the interior of the containing unit 9 by providing at least one selected from the support unit 19a and the support unit 19b.

In such a case, the end portions of the support unit 19a and the support unit 19b may be bonded to the light emitting unit 10 or may be in contact with the light emitting unit 10. The end portion of the support unit 19b may be bonded to the light emitting unit 10a or may be in contact with the light emitting unit 10a.

By providing at least one selected from the support unit 19a and the support unit 19b, stable operations of the illumination devices 11a to 11f, fewer failures, etc., can be realized even in the case where, for example, the illumination devices 11a to 11f are used upright in a perpendicular direction, the illumination devices 11a to 11f are mounted to the ceiling, or the illumination devices 11a to 11f are mounted in an environment subjected to vibrations. By the support unit 19b having a prescribed form, the light introduced to the interior of the support unit 19b can be radiated to diffuse outside the illumination device.

The relationship between the form and the light extraction efficiency of the support unit 19b will now be described.

Figure 4A:
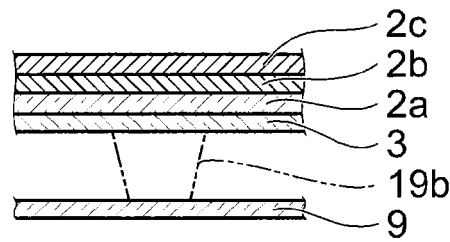
FIG. 4A is a schematic view showing conditions of a simulation and FIG. 4B is a graph showing a relation ship between configuration and light extraction efficiency of the support unit 19$b$.

FIG. 4A is a schematic view showing the conditions of a simulation.

The electrode 2a was made of indium tin oxide with a thickness dimension of 150 nm and a refractive index of 1.89.

The organic light emitting layer 2b had a thickness dimension of 100 nm and a refractive index of 1.71.

The electrode 2c was made of aluminum with a thickness dimension of 150 nm and a refractive index of 0.76. The substrate 3 and the containing unit 9 were made of glass with a thickness dimension of 0.7 mm and a refractive index of 1.52.

In the simulation, the refractive indexes are for light of a wavelength of 550 nm.

The forms of the support unit 19b were a form A in which the cross-sectional area gradually decreases from the inner wall side of the containing unit 9 toward the light emitting unit 10 (toward the substrate 3), a form B having a constant cross-sectional area, and a form C in which the cross-sectional area gradually increases. "Without the support unit 19b" is the case where air (having a refractive index of 1) is between the substrate 3 and the containing unit 9.

The form A and the form C were circular-conic trapezoids for which the diametrical dimension of the end surface having the large cross-sectional area was 4 mm, the diametrical dimension of the end surface having the small cross-sectional area was 2 mm, and the height dimension was 2 mm.

The form B was a circular column for which the diametrical dimension of the end surface was 4 mm and the height dimension was 2 mm.

The refractive index n of the support unit 19b was 1.2, 1.5, and 1.8.

The simulation was performed by ray tracing; and 50000 rays of light flux were emitted from the organic light emitting layer 2b.

Figure 4B:
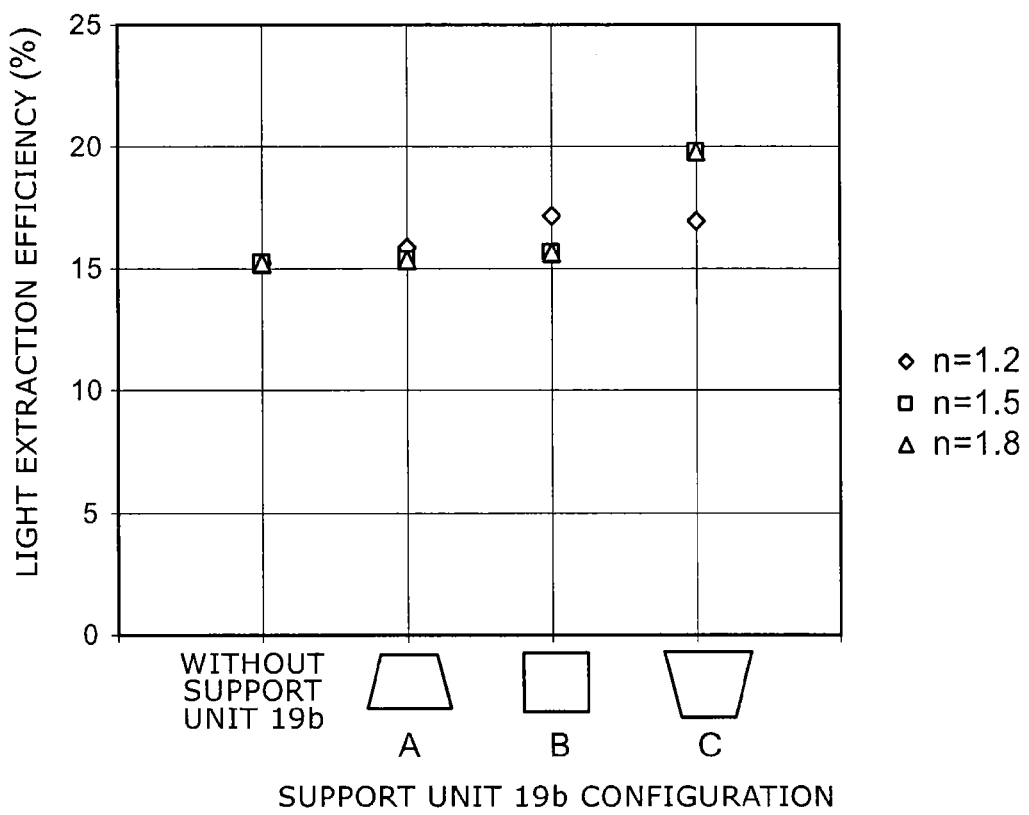

FIG. 4B is a graph showing the results of the simulation.

It can be seen from FIG. 4B that the light extraction efficiency changes as the form of the support unit 19b changes.

In such a case, the light extraction efficiency can be increased by using the form C in which the cross-sectional area gradually increases from the inner wall side of the containing unit 9 toward the light emitting unit 10 (toward the substrate 3).

The relationship between the refractive index n and the light extraction efficiency of the support unit 19b will now be described.

Figure 5:
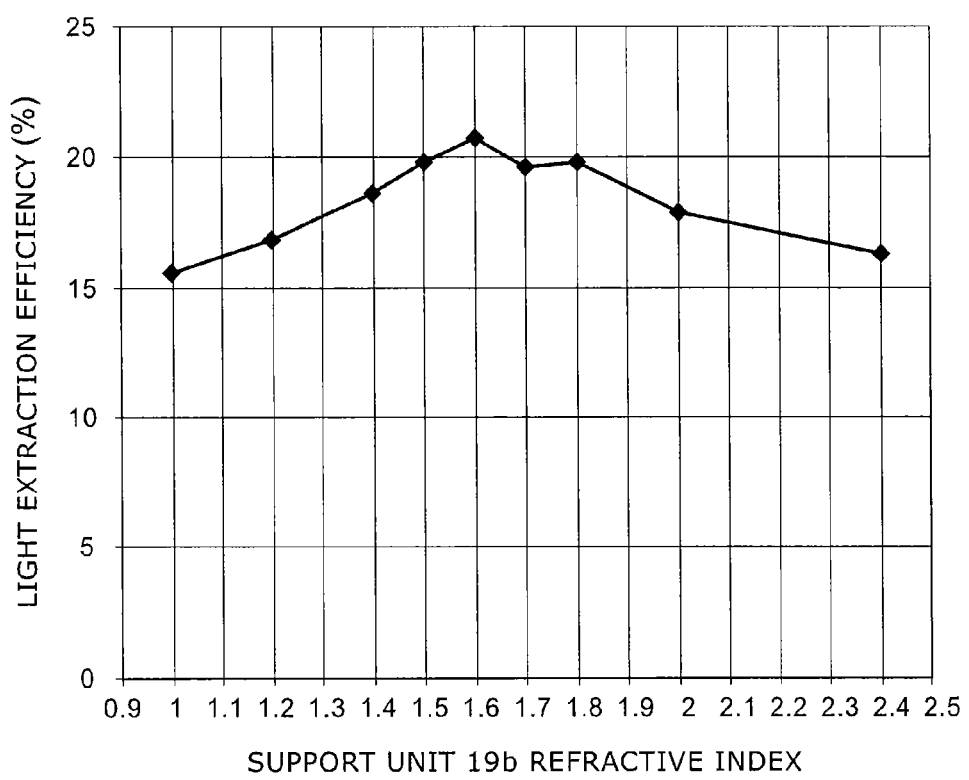
FIG. 5 is a graph showing a relationship between refractive index n and light extraction efficiency of the support unit 19$b$.

FIG. 5 is a graph showing the relationship between the refractive index n and the light extraction efficiency of the support unit 19b.

The form of the support unit 19b was the form C described above; and the conditions of the simulation were those shown in FIG. 4A.

It can be seen from FIG. 5 that the light extraction efficiency can be higher than for the portion without the support unit 19b (the portion where the refractive index is 1) by the refractive index n of the support unit 19b being greater than 1 and not more than 2.4, and more favorably not less than 1.2 and not more than 2.0.

Third Embodiment

Figure 6:
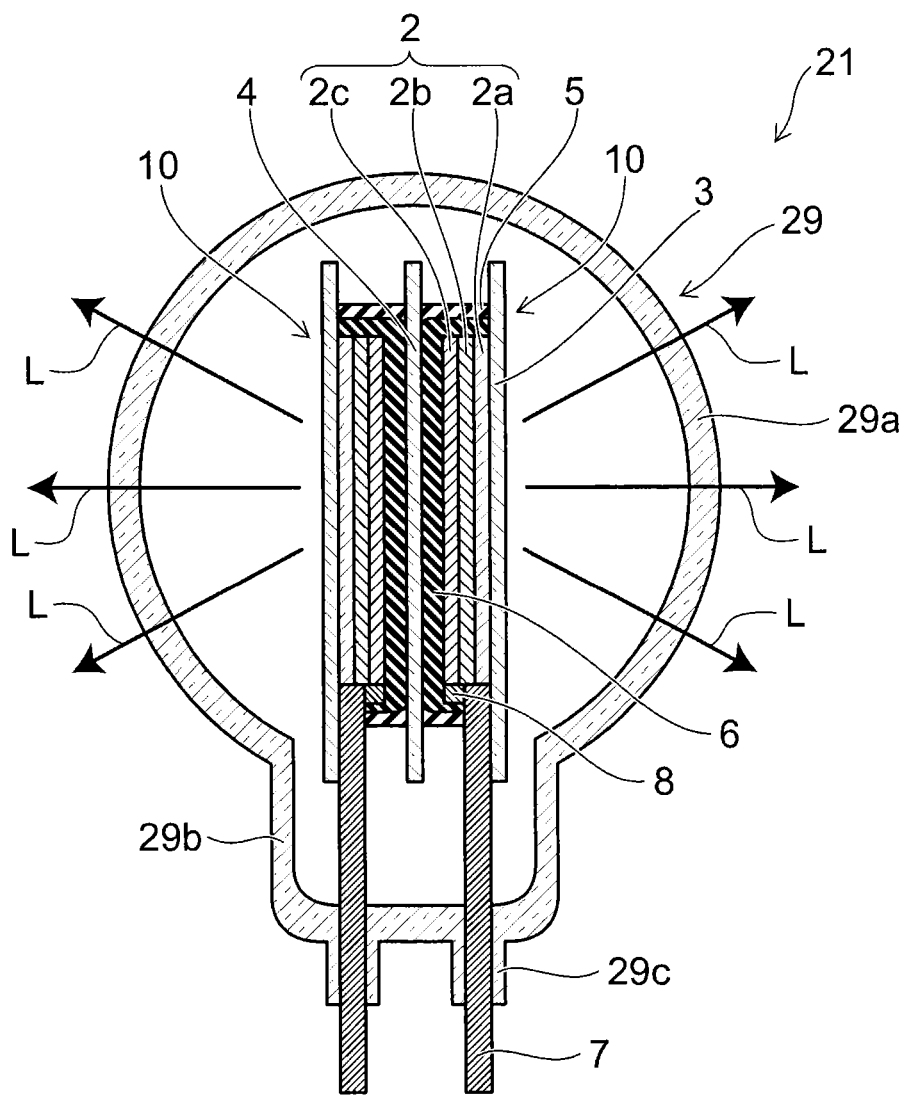
FIG. 6 is a schematic cross-sectional view showing an illumination device according to a third embodiment.
Figure 7:
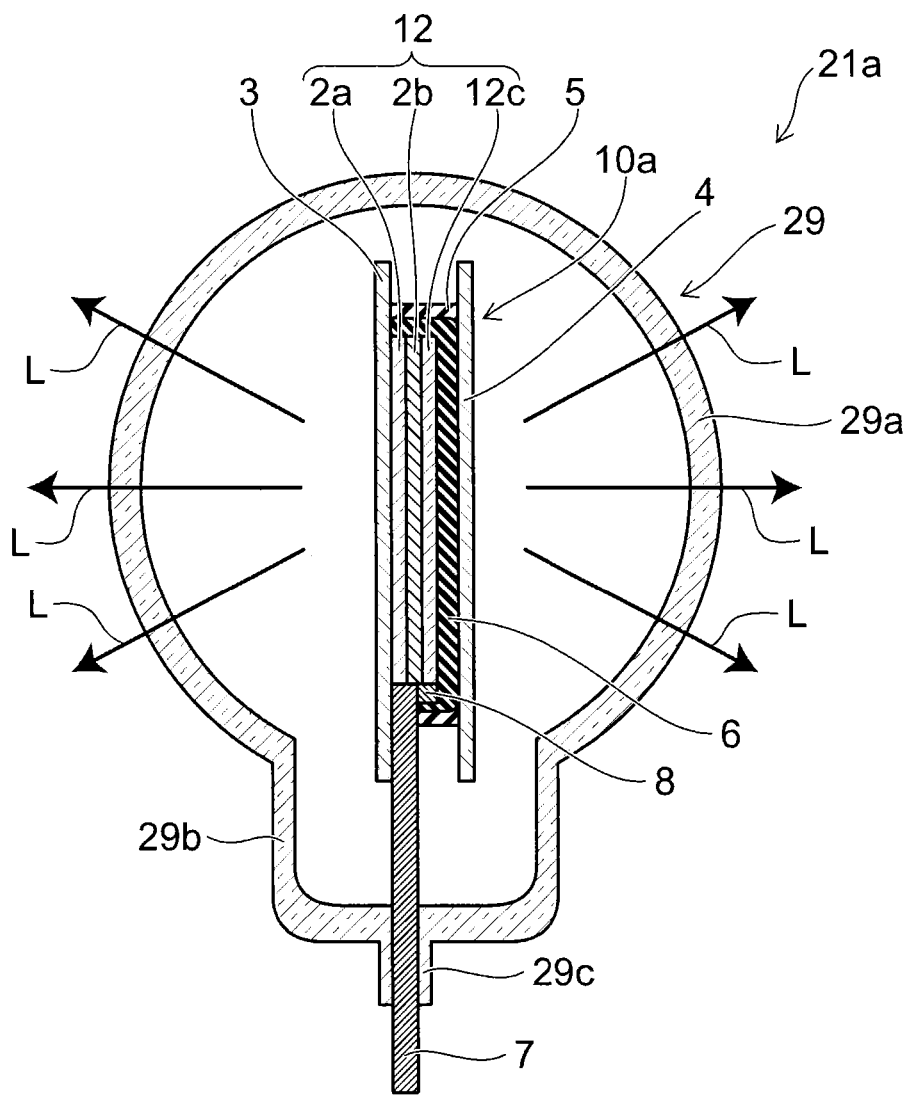
FIG. 7 is a schematic cross-sectional view showing an illumination device according to a third embodiment.

FIG. 6 and FIG. 7 are schematic cross-sectional views showing illumination devices according to a third embodiment.

As shown in FIG. 6, the light emitting unit 10, the connection units 7, the connection units 8, and a containing unit 29 are provided in an illumination device 21.

Two light emitting units 10 are provided in the illumination device 21 shown in FIG. 6. The two light emitting units 10 are provided by bonding the substrates 4 to each other. The substrates 4 may be a component that is common to the two light emitting units 10.

The containing unit 29 includes a radiating unit 29a, a neck unit 29b, and sealing units 29c (corresponding to examples of the second sealing units).

The containing unit 29 has a space in the interior of the containing unit 29 that is airtight and contains the light emitting unit 10 inside the space.

The radiating unit 29a has a spherical configuration; and the two light emitting units 10 are contained in the interior. In such a case, the two light emitting units 10 are held inside the space of the interior of the radiating unit 29a.

The neck unit 29b has a quadrilateral tubular configuration; and the space of the interior of the neck unit 29b communicates with the space of the interior of the radiating unit 29a. The sealing units 29c are provided to close the end portion of the neck unit 29b on the side opposite to the radiating unit 29a side. The sealing units 29c seal the portions of the connection units 7 and the connection units 8 extending outside the neck unit 29b.

The radiating unit 29a is transmissive to the light L. The material of the radiating unit 29a may be, for example, similar to that of the containing unit 9 described above.

Although the materials of the neck unit 29b and the sealing units 29c are not particularly limited, the materials of the neck unit 29b and the sealing units 29c may be similar to, for example, that of the radiating unit 29a. In the case where the materials of the radiating unit 29a, the neck unit 29b, and the sealing units 29c are the same, the radiating unit 29a, the neck unit 29b, and the sealing units 29c can be formed integrally.

The configuration, formation method, etc., of the sealing units 29c may be similar to those of the sealing units 9a described above.

Similarly to the containing unit 9 described above, the space of the interiors of the radiating unit 29a and the neck unit 29b is in a state of being depressurized below atmospheric pressure or a state of having an inert gas such as argon gas, nitrogen gas, etc., sealed.

The support unit 19b described above may be further provided.

As shown in FIG. 7, the light emitting unit 10a, the connection unit 7, the connection unit 8, and the containing unit 29 are provided in an illumination device 21a.

The support unit 19b described above may be further provided.

In the case of the illumination device 21a shown in FIG. 7, the electrode 12c that is transmissive to the light radiated from the organic light emitting layer 2b is provided. Therefore, the light L is radiated not only from the electrode 2a side but also from the electrode 12c side.

In the illumination devices 21 and 21a as well, effects similar to those of the illumination devices 1 and 11a to 11f described above can be provided.

The light L can be radiated radially from the radiating unit 29a having the spherical configuration as shown in FIG. 6 and FIG. 7. Therefore, a wide light distribution angle can be obtained.

Fourth Embodiment

Figure 8:
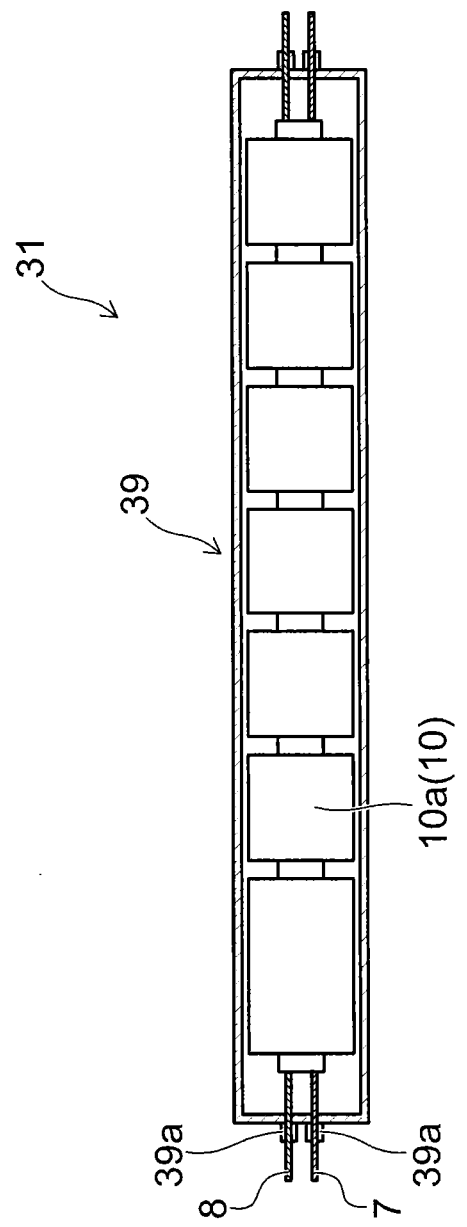
FIG. 8 is a schematic cross-sectional view showing an illumination device according to a fourth embodiment.

FIG. 8 is a schematic cross-sectional view showing an illumination device according to a fourth embodiment.

As shown in FIG. 8, the light emitting unit 10a, the connection units 7, the connection units 8, and a containing unit 39 are provided in the illumination device 31.

The support unit 19b described above may be further provided.

The containing unit 39 has a cylindrical configuration having two closed ends in the longitudinal direction. The containing unit 39 has a space in the interior of the containing unit 39 that is airtight and contains the light emitting unit 10a inside the space.

Two sealing units 39a (corresponding to examples of the second sealing units) that seal the portions of the connection unit 7 and the connection unit 8 extending outside the containing unit 39 are provided at two longitudinal-direction end portions of the containing unit 39. In such a case, the two sealing units 39a can be formed integrally with the longitudinal-direction end portions of the containing unit 39.

Multiple light emitting units 10a that are electrically connected in series are contained in the interior of the containing unit 39. In such a case, the multiple light emitting units 10a are held inside the space of the interior of the containing unit 39.

The containing unit 39 is transmissive to the light L. The material of the containing unit 39 may be similar to the material of the containing unit 9 described above. Similarly to the containing unit 9 described above, the space of the interior of the containing unit 39 is in a state of being depressurized below atmospheric pressure or a state of having an inert gas such as argon gas, nitrogen gas, etc., sealed.

The configurations, materials, formation methods, etc., of the sealing units 39a may be similar to those of the sealing units 9a described above.

In the case of the illumination device 31 shown in FIG. 8, the electrode 12c that is transmissive to the light radiated from the organic light emitting layer 2b is provided. Therefore, the light L is radiated not only from the electrode 2a side but also from the electrode 12c side.

The light emitting unit 10, in which the electrode 2c that is reflective to the light radiated from the organic light emitting layer 2b is provided, also may be included. In such a case, the light L is radiated toward the side that the electrode 2a faces. Therefore, the containing unit 39 may have a cross-sectional configuration (e.g., a semicircular configuration) in which the side toward which the light L is radiated is a curved surface.

In the illumination device 31 as well, effects similar to those of the illumination devices 1 and 11a to 11f described above can be provided.

The light L can be radiated radially from the containing unit 39. Therefore, a wide light distribution angle can be obtained.

In each of the embodiments described above, an optical component that diffuses the light may be provided on the surface of the containing unit on the side where the light L is radiated. For example, an unevenness or a Fresnel lens may be provided on the surface of the containing unit on the side where the light L is radiated. Also, a diffusing agent may be coated onto the inner wall of the containing unit; or a diffusing agent may be included inside the wall of the containing unit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. An illumination device, comprising:
   a light emitting unit including
      a first substrate,
      a second substrate,
      an organic electroluminescent element provided between the first substrate and the second substrate, and
      a first sealing unit sealing circumferential edge portions between the first substrate and the second substrate;
   a connection unit electrically connected to the organic electroluminescent element;
   a containing unit having a space in an interior of the containing unit, the space being airtight, the containing unit containing the light emitting unit inside the space;
   a second sealing unit provided in the containing unit, the second sealing unit sealing between a portion of the connection unit extending outside the containing unit and the containing unit; and
   a support unit provided at an inner wall of the containing unit supporting the light emitting unit.

2. The device according to claim 1, wherein a thermal conductivity of the support unit is not more than 1.1 times a thermal conductivity of the containing unit.

3. The device according to claim 1, wherein a material of the support unit is a same as a material of the containing unit.

4. The device according to claim 1, wherein the support unit supports a side of at least one selected from the first substrate and the second substrate.

5. The device according to claim 1, wherein the support unit contacts a side of at least one selected from the first substrate and the second substrate.

6. The device according to claim 1, wherein the support unit is bonded to a side of at least one selected from the first substrate and the second substrate.

7. The device according to claim 1, wherein the support unit has a columnar configuration.

8. The device according to claim 1, wherein the support unit has a form having a cross-sectional area gradually increasing from a side of the inner wall of the containing unit toward a side of the light emitting unit.

9. The device according to claim 1, wherein the support unit has a form having a cross-sectional area gradually decreasing from a side of the inner wall side of the containing unit toward a side of the light emitting unit.

10. The device according to claim 1, wherein the support unit is light-transmissive to light radiated from the organic electroluminescent element.

11. The device according to claim 1, wherein a refractive index of the support unit is greater than 1 and not more than 2.4.

12. The device according to claim 1, wherein a refractive index of the support unit is greater than 1.2 and not more than 2.0.

13. An illumination device, comprising:
   a light emitting unit including
      a first substrate,
      a second substrate,
      an organic electroluminescent element provided between the first substrate and the second substrate, and
      a first sealing unit sealing circumferential edge portions between the first substrate and the second substrate;
   a connection unit electrically connected to the organic electroluminescent element;
   a containing unit having a space in an interior of the containing unit, the space being airtight, the containing unit containing the light emitting unit inside the space; and
   a second sealing unit provided in the containing unit, the second sealing unit sealing between a portion of the connection unit extending outside the containing unit and the containing unit;
   wherein the connection unit holds the light emitting unit inside the space.

14. The device according to claim 13, wherein the organic electroluminescent element includes:
   a first electrode;
   a second electrode facing the first electrode; and
   an organic light emitting layer provided between the first electrode and the second electrode, and
   at least one selected from the first electrode and the second electrode is light-transmissive to light radiated from the organic light emitting layer.

15. The device according to claim 13, wherein the containing unit has a tubular configuration having two closed ends in a longitudinal direction.

16. The device according to claim 13, wherein a cross-sectional outline of the containing unit has a flattened configuration.

17. The device according to claim 13, wherein the containing unit includes a radiating unit having a spherical configuration, the radiating unit having the airtight space in an interior of the radiating unit.

18. The device according to claim 13, wherein
   the containing unit has a cylindrical configuration having two closed ends in a longitudinal direction, and the light emitting unit is provided in a plurality; and
   a plurality of the light emitting units being contained inside the space of the interior of the containing unit, the plurality of light emitting units being electrically connected in series.

19. The device according to claim 13, wherein the space is in a state of being depressurized below atmospheric pressure or a state of having an inert gas sealed in the space.

* * * * *